(12) United States Patent
Aoki et al.

(10) Patent No.: US 8,673,125 B2
(45) Date of Patent: Mar. 18, 2014

(54) SUBSTRATE CONVEYER AND VACUUM PROCESSING APPARATUS

(75) Inventors: Kazunari Aoki, Kawasaki (JP); Kazuhito Watanabe, Tama (JP)

(73) Assignee: Canon Anelva Corporation, Kawasaki-Shi, Kanagawa-Ken (JP)

( * ) Notice: Subject to any disclaimer, the term of this patent is extended or adjusted under 35 U.S.C. 154(b) by 130 days.

(21) Appl. No.: 13/334,630

(22) Filed: Dec. 22, 2011

(65) Prior Publication Data

US 2012/0160674 A1 Jun. 28, 2012

(30) Foreign Application Priority Data

Dec. 27, 2010 (JP) ................................. 2010-291272

(51) Int. Cl.
*C23C 14/50* (2006.01)

(52) U.S. Cl.
USPC .................................. 204/298.23; 198/750.1

(58) Field of Classification Search
None
See application file for complete search history.

(56) References Cited

U.S. PATENT DOCUMENTS

2003/0183490 A1* 10/2003 Eschenweck .............. 198/750.1

FOREIGN PATENT DOCUMENTS

| JP | 5-049232 A | | 2/1993 |
|---|---|---|---|
| JP | 5-052248 A | | 3/1993 |
| JP | 2000-032733 A | | 1/2000 |
| JP | 20000-32733 | * | 1/2000 |
| JP | 2004-218844 A | | 8/2004 |

OTHER PUBLICATIONS

Doshi, Dhiren M., Living Schience Physics 10 "Electromagnets", 2008, p. 139.*

* cited by examiner

*Primary Examiner* — Keith Hendricks
*Assistant Examiner* — Timon Wanga
(74) *Attorney, Agent, or Firm* — Buchanan Ingersoll & Rooney PC

(57) ABSTRACT

An apparatus includes a chamber configured to form a reduced-pressure space, a carrier which holds a substrate, and a conveyer which conveys the carrier in the chamber. The chamber includes a side wall including an opening portion, and a partition wall arranged in the opening portion, the conveyer includes a permanent magnet provided on the carrier, and a driving magnet arranged outside the partition wall so as to drive the carrier, and the partition wall includes a first portion arranged between the driving magnet and a path through which the carrier passes, and a second portion arranged to connect the first portion to the side wall, the first portion having a smooth surface in a portion in which the first portion faces the path, and the first portion including a plurality of ribs arranged on a surface thereof on a side on which the driving magnet is arranged.

7 Claims, 15 Drawing Sheets

F I G. 5
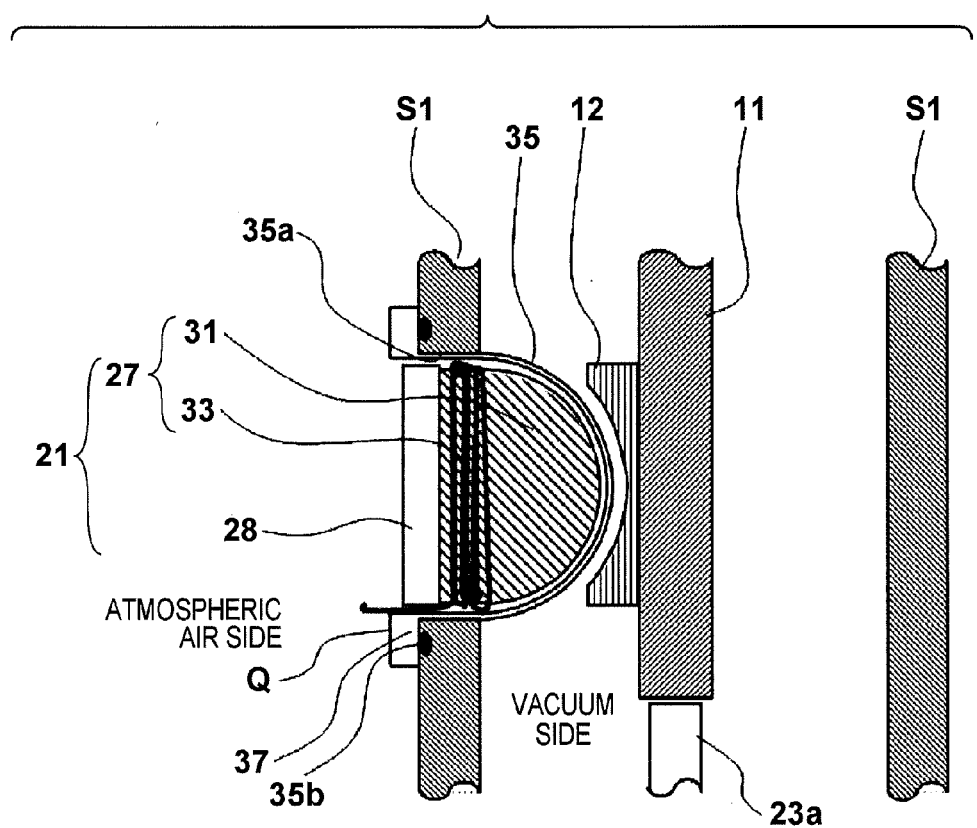

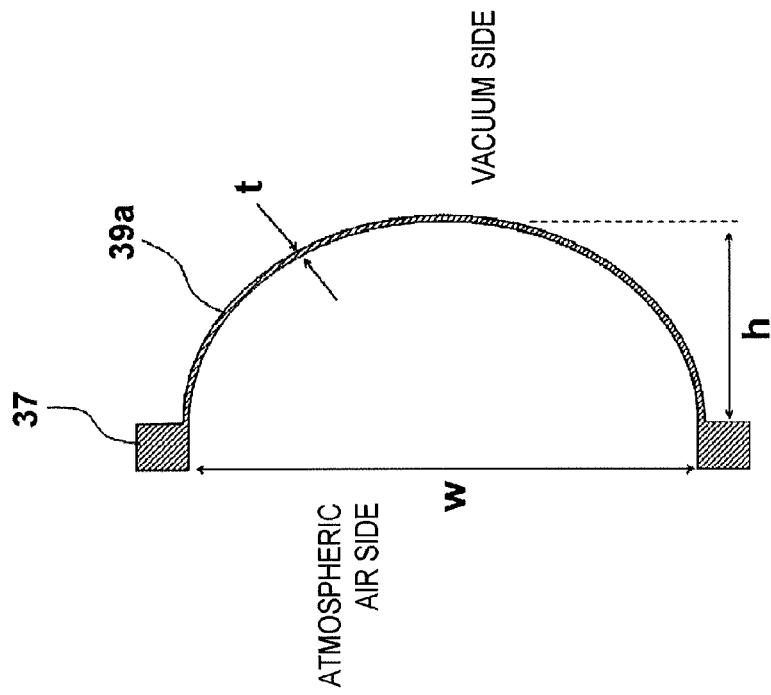
F I G. 6A
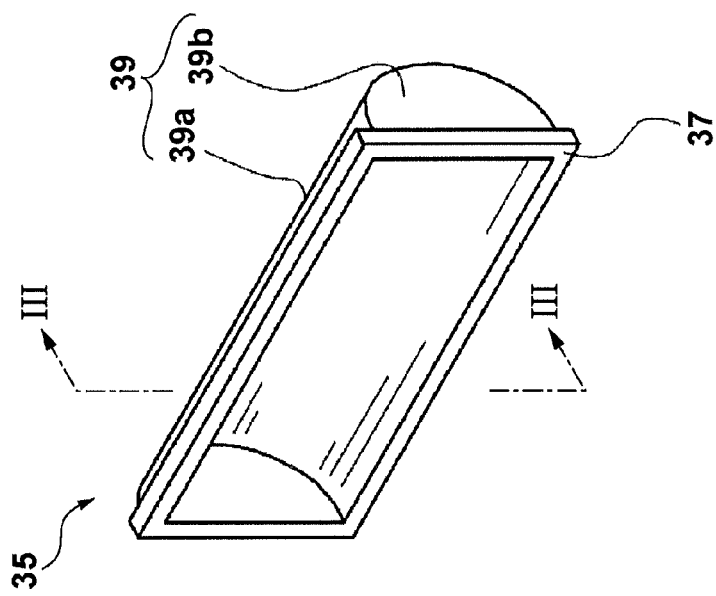
F I G. 6B

F I G. 11
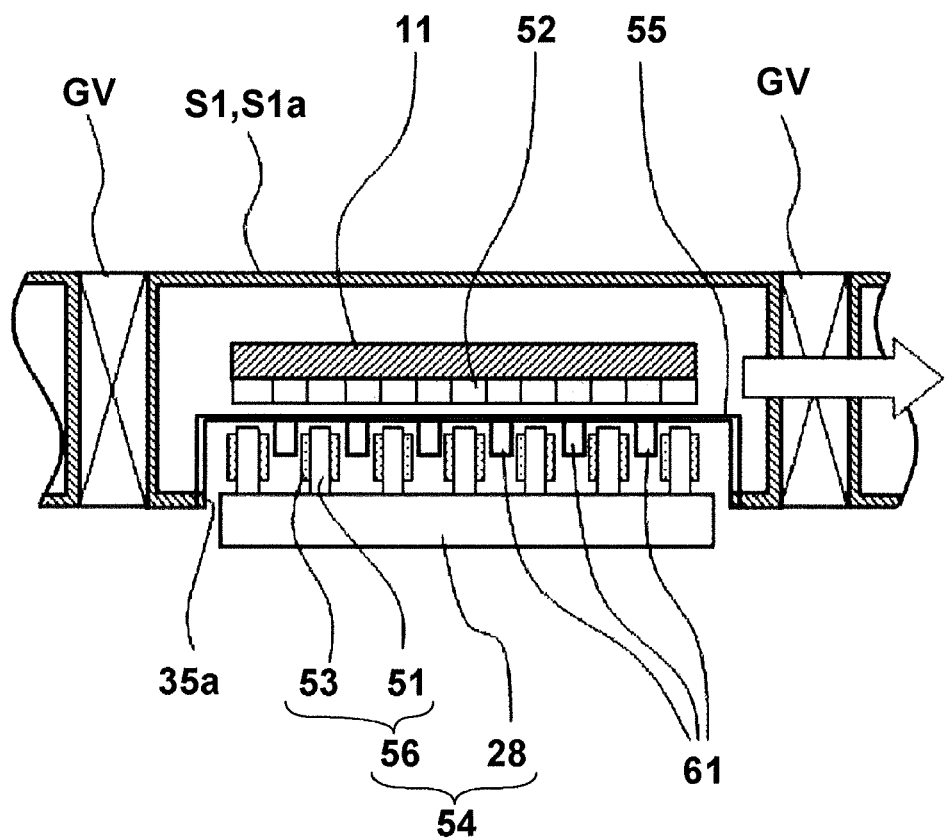

F I G. 15
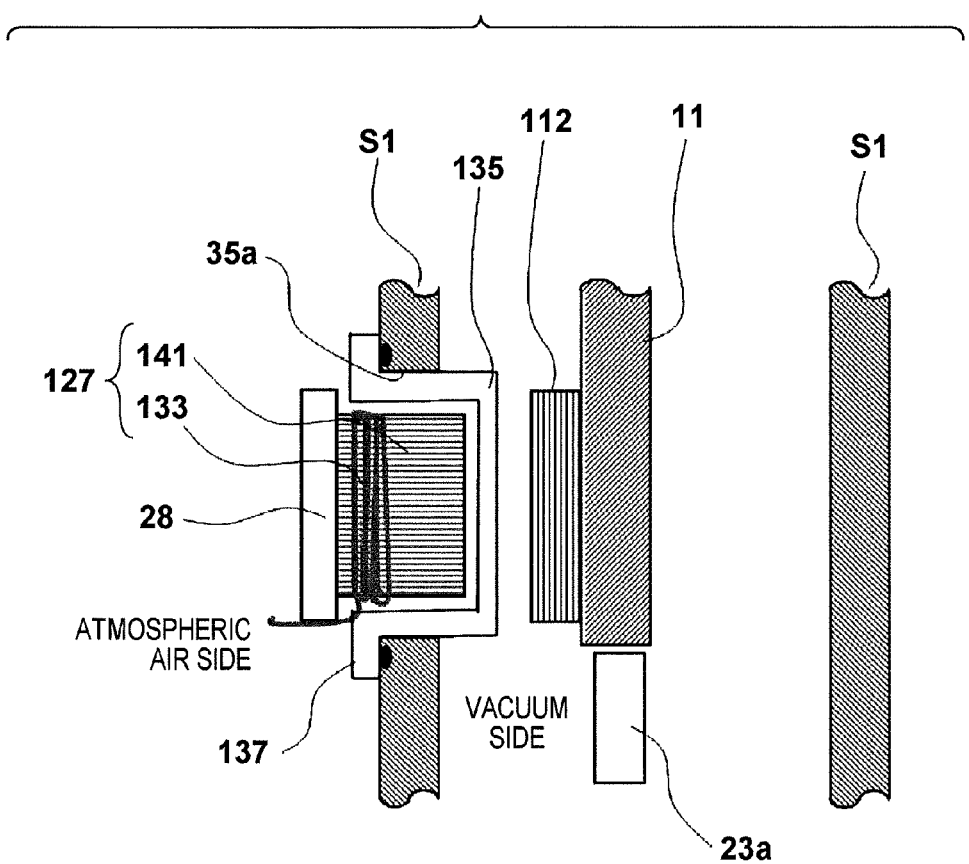

SUBSTRATE CONVEYER AND VACUUM PROCESSING APPARATUS

BACKGROUND OF THE INVENTION

1. Field of the Invention

The present invention relates to a substrate conveyer and, more particularly, to a substrate conveyer which conveys a substrate in a vacuum processing apparatus, and a vacuum processing apparatus having the substrate conveyer.

2. Description of the Related Art

An inline vacuum processing apparatus is configured to convey a substrate to each chamber and sequentially perform predetermined vacuum processes, while the substrate is held by a carrier. The carrier is equipped with a permanent magnet, whereas a magnetic screw is rotatably disposed on the chamber side to be separated from the vacuum atmosphere in each chamber by a vacuum seal. Magnetic poles with opposite polarities are alternately generated on the surface of the magnetic screw in a spiral pattern. A substrate conveyer is configured to form magnetic coupling between the portion magnetized in a spiral pattern, and the permanent magnet of the carrier, thereby moving the carrier with rotation of the magnetic screw (see, for example, Japanese Patent Laid-Open Nos. 2004-218844, 5-49232, and 5-52248).

Japanese Patent Laid-Open No. 2000-032733 discloses a flat motor including a movable element having a magnet, and a stator (base body) having an armature coil. The stator is arranged in a vacuum chamber, which has an upper portion formed by a flat ceramic plate, and a lower portion formed by a stator yoke. The movable element is arranged on the ceramic plate of the stator via an air slider, and can move on the ceramic plate. A substrate table is arranged on the movable element.

To improve the efficiency of a motor including a vacuum partition wall arranged between the magnet of the movable element and that of the stator, the thickness of the vacuum partition wall is desirably reduced. On the other hand, as the thickness of the vacuum partition wall reduces, its strength may decrease.

SUMMARY OF THE INVENTION

The present invention provides a technique advantageous in reducing the thickness of a partition wall to improve the efficiency.

The first aspect of the present invention provides a substrate conveyer which conveys, in a chamber, a carrier that holds a substrate, the conveyer comprising: a permanent magnet provided on the carrier; a driving magnet which is provided in the chamber to be opposed to the permanent magnet, and includes a plurality of stator elements each including a stator iron core and a winding wire wound around the stator iron core; and a vacuum partition wall which is provided between the permanent magnet and the driving magnet, and configured to maintain, in a vacuum atmosphere, a space in which the permanent magnet is arranged, the vacuum partition wall including an upper plate portion including a surface that is opposed to the permanent magnet and having a smooth surface, pipe-shaped side wall portions connected to an edge of the upper plate portion, and a plurality of deformation preventive portions which are suspended between portions in which the side wall portions are opposed to each other, are provided integrally with a surface of the upper plate portion, that is opposite to the smooth surface, and suppress bending of the upper plate portion, wherein the deformation preventive portions are arranged between adjacent coils.

The second aspect of the present invention provides an apparatus including a chamber configured to form a reduced-pressure space, a carrier which holds a substrate, and a conveyer which conveys the carrier in the chamber, the chamber including a side wall including an opening portion, and a partition wall arranged in the opening portion, the conveyer including a permanent magnet provided on the carrier, and a driving magnet arranged outside the partition wall so as to drive the carrier, and the partition wall including a plate-shaped, first portion arranged between the driving magnet and a path through which the carrier passes, and a pipe-shaped, second portion arranged to connect the first portion and the side wall to each other, the first portion having a smooth surface in a portion in which the first portion faces the path, and the first portion including a plurality of ribs arranged on a surface thereof on a side on which the driving magnet is arranged.

Further features of the present invention will become apparent from the following description of exemplary embodiments with reference to the attached drawings.

BRIEF DESCRIPTION OF THE DRAWINGS

FIG. 5 is an enlarged view for explaining a portion H in FIG. 3;

FIGS. 6A and 6B are a perspective view and a sectional view, respectively, showing a vacuum partition wall according to the first embodiment of the present invention;

FIG. 11 is an enlarged view for explaining a vacuum processing apparatus according to the third embodiment of the present invention;

FIG. 15 is an enlarged view for explaining a vacuum processing apparatus including a vacuum partition wall having a flat cross-sectional shape.

DESCRIPTION OF THE EMBODIMENTS

Modes for carrying out the present invention will be described below with reference to the accompanying drawings. The following description provides detailed examples of the present invention, and does not limit the present invention, so various changes and modifications can be made without departing from the scope of the present invention, as a matter of course. Note that in this specification, the direction in which a carrier 11 travels is defined as the horizontal direction, and a direction perpendicular to the direction in which the carrier 11 travels is defined as the vertical direction.

First Embodiment

Figure 1:
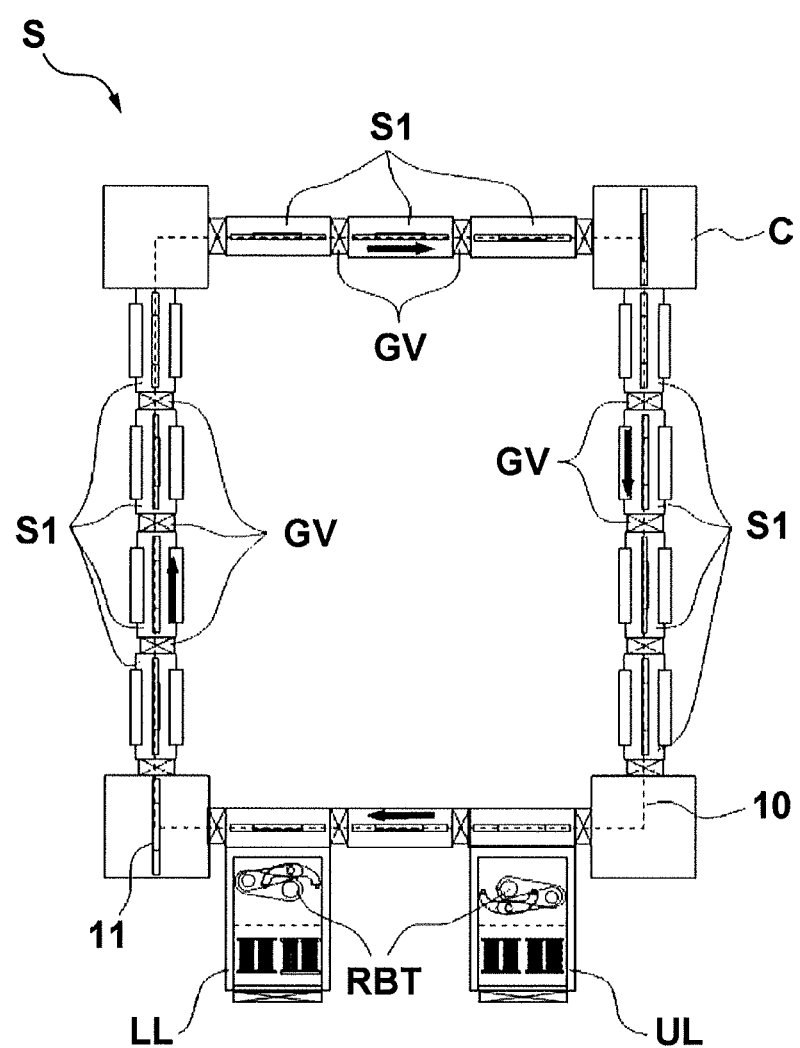
FIG. 1 is a view showing the schematic configuration of a vacuum processing apparatus according to the first embodiment of the present invention.
Figure 2:
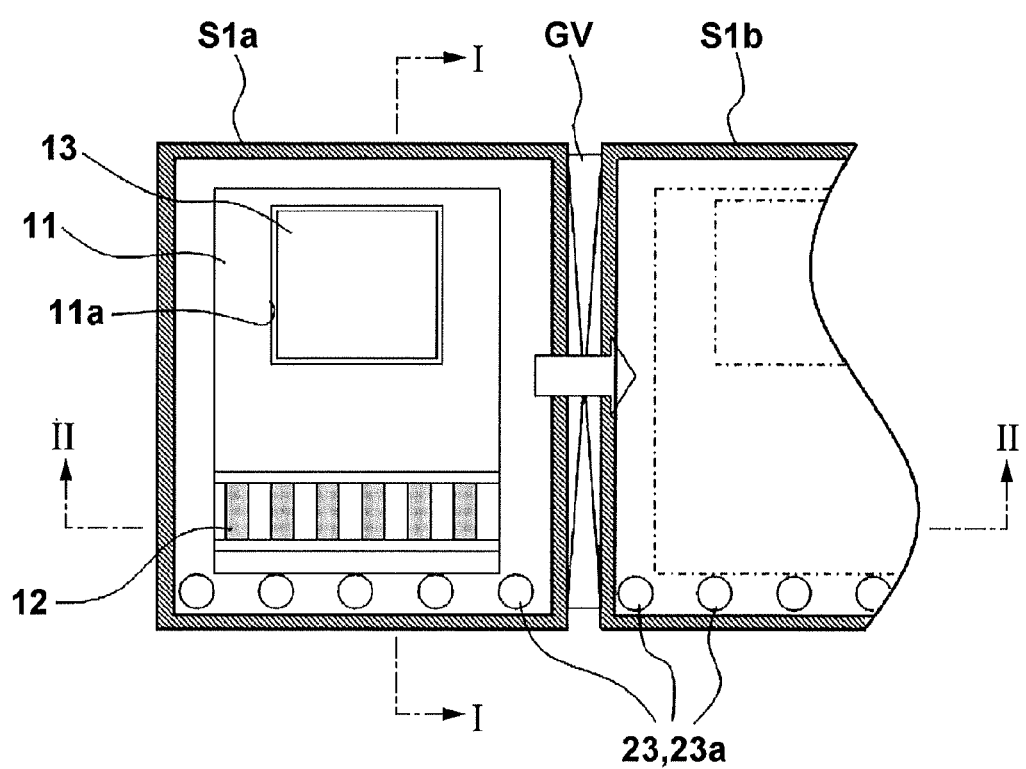
FIG. 2 is a view (a sectional view taken along the conveyance direction) showing the schematic configuration of process chambers according to the first embodiment of the present invention.
Figure 3:
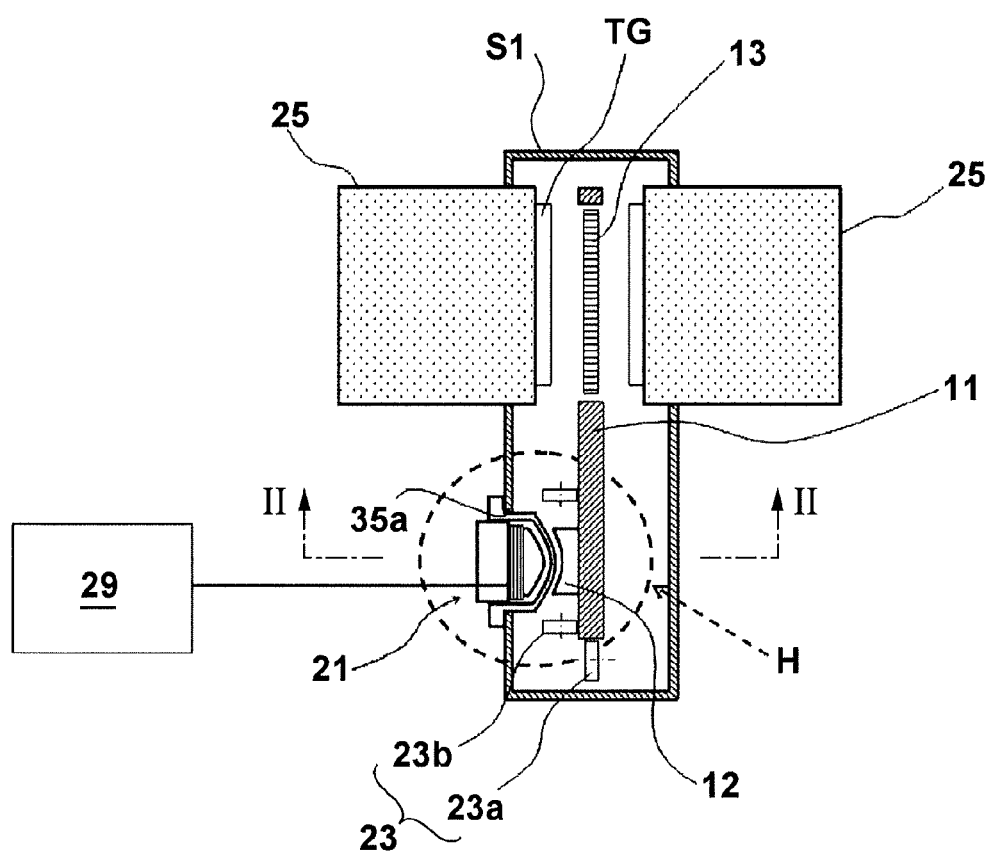
FIG. 3 is a sectional view taken along a line I-I in FIG. 2.
Figure 4:
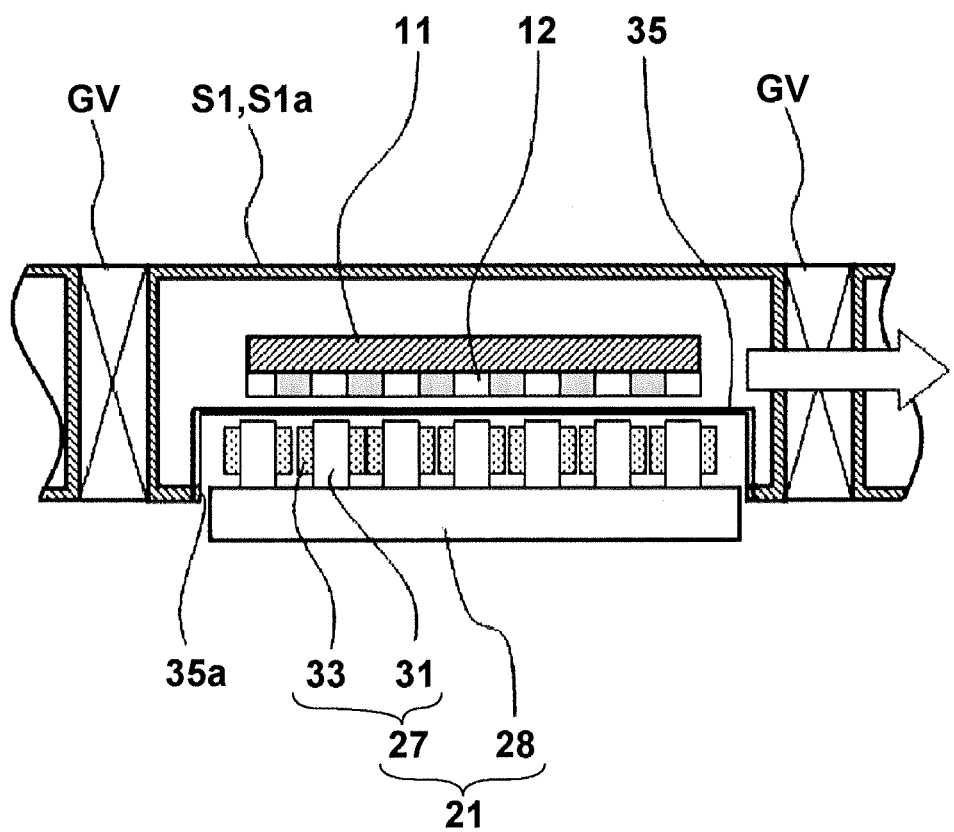
FIG. 4 is a sectional view taken along a line II-II in FIG. 2.
Figure 7:
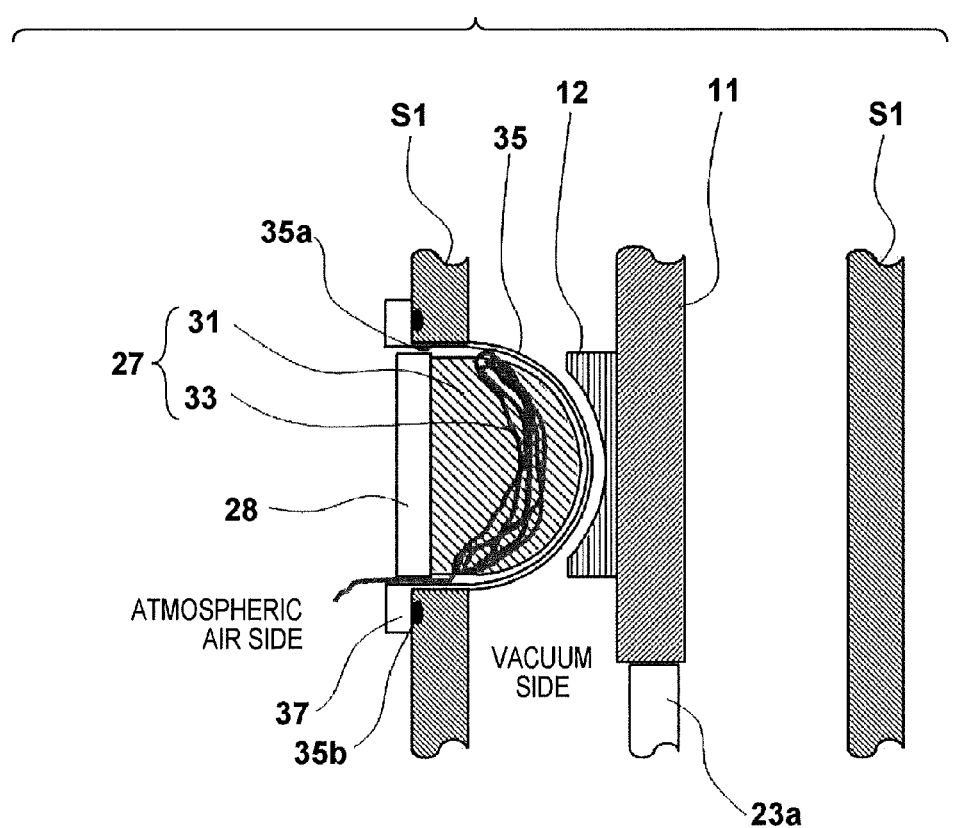
FIG. 7 is a view illustrating another example of the configuration of the vacuum processing apparatus according to the first embodiment of the present invention.

FIGS. 1 to 7 are views for explaining a substrate conveyer and a vacuum processing apparatus according to the first embodiment of the present invention, in which FIG. 1 is a view showing the schematic configuration of the vacuum processing apparatus; FIG. 2 is a view (a sectional view taken along the conveyance direction) showing the schematic configuration of process chambers; FIG. 3 is a sectional view taken along a line I-I in FIG. 2; FIG. 4 is a sectional view taken along a line II-II in FIG. 2; FIG. 5 is an enlarged view for explaining a portion H in FIG. 3; FIGS. 6A and 6B are a perspective view and a sectional view, respectively, showing a vacuum partition wall; and FIG. 7 is a view illustrating another example of the configuration of the vacuum processing apparatus. Note that some members are not shown in these drawings to avoid their complications.

A vacuum processing apparatus S shown in FIG. 1 exemplifies an apparatus which processes a substrate in a reduced-pressure space, and uses an inline film forming apparatus, in which a plurality of chambers which function as a load chamber LL, an unload chamber UL, corner chambers C, process chambers S1, and other process chambers are connected to each other via gate valves GV in an endless shape. A substrate is loaded into the load chamber LL while being mounted in a substrate cassette, and is transferred into other substrate cassettes by an inter-cassette transfer robot. Then, the substrate is transferred onto a carrier 11 (to be described later) by a robot RBT, is conveyed along a substrate conveyance path (conveyance path) while being mounted on the carrier 11, and undergoes a predetermined process in each process chamber. The substrate having undergone the predetermined processes is unloaded from the unload chamber UL.

FIGS. 2 to 4 show schematic views of the process chambers S1. FIG. 2 is a view showing two adjacent process chambers S1 (they are also denoted by reference numerals S1a and S1b) when viewed in a side view, FIG. 3 is a schematic view showing a cross-section taken along a line I-I in FIG. 2, and FIG. 4 is a schematic view showing a cross-section taken along a line II-II in FIG. 3. The process chambers S1 use, for example, nearly rectangular parallelepiped chambers having interiors which can be evacuated into a vacuum, and are formed by, for example, stainless steel or aluminum alloy. The adjacent process chambers S1 are connected to each other via the gate valve GV. The process chamber S1 includes a process unit for performing a sputtering process, a substrate conveyer which conveys the carrier 11 along a substrate conveyance path 10, and a vacuum pump (not shown) which evacuates the interior of the process chamber S1 into a vacuum.

A substrate 13 is conveyed from the preceding process (upstream side) by the substrate conveyer, and stops at a position opposed to a target TG or passes through this position. At this time, a film forming substance sputtered from the target TG is deposited on the substrate 13. The substrate 13 having a film formed on it is conveyed to the subsequent process (downstream side). A large number of targets TG or a plurality of process chambers S1 are provided in correspondence with the types and number of sputter substances to be formed on the substrate 13. Note that when the load chamber LL is connected to the upstream side of the two process chambers S1 connected to each other via the gate valve GV, shown in FIG. 2, and the unload chamber UL is connected to the downstream side of these process chambers S1, an inline film forming apparatus including chambers linearly connected to each other can be formed.

The substrate conveyer can use a so-called vertical conveyer that conveys a substrate in the vertical orientation (to be precise, in the orientation in which the principal surface of the substrate is parallel to the vertical direction). Such a substrate conveyer can convey the carrier 11 in the vertical orientation. The substrate conveyer can transfer the substrate 13 along the substrate conveyance path 10 provided to extend through the process chambers S1 which constitute the inline film forming apparatus. The substrate conveyance path 10 includes a linear motor stator (to be referred to as a driving magnet hereinafter) 21 disposed on the side of each process chamber S1, a driver 29 which controls excitation of each driving magnet 21, and a plurality of guides 23 which movably support the carrier 11.

Also, a nearly rectangular opening portion 35a is formed in the side wall of each process chamber S1 to extend along the substrate conveyance path 10, and a vacuum partition wall 35 (to be described later) is airtightly mounted in the opening portion 35a. The interior of the vacuum partition wall 35 can be evacuated into a vacuum, like that of each process chamber 51. Although a substrate conveyer which conveys the substrate 13 in the vertical orientation will be taken as an example in this embodiment, the present invention is also applicable to a substrate conveyer which conveys the substrate 13 in the horizontal orientation, as a matter of course.

Each guide 23 uses, for example, a rotatable roller (a roller supported by a bearing), and includes a first guide 23a which receives the self weight of the carrier 11, and a second guide 23b which receives the horizontal attractive and repulsive forces received from the driving magnet 21 by the carrier 11. The carrier 11 is supported by the rotatable guides 23 so as to smoothly move along the substrate conveyance path 10 in accordance with the magnetic force of the driving magnets 21. The driving magnet 21 is arranged on the atmospheric air side (atmospheric pressure atmosphere side) of the vacuum partition wall 35, and the guide 23 is arranged on the vacuum side (vacuum atmosphere side) of the vacuum partition wall 35. The driving magnet 21 and vacuum partition wall 35 will be described later.

The carrier 11 is a component capable of moving by circulating through the process chambers S1 along the substrate conveyance path 10 in the process chambers S1, while holding the substrate 13. The carrier 11 includes a movable element which obtains a thrust from the driving magnets 21, a holder portion which holds the substrate 13, and a slider which abuts against the guides 23 and is equipped with the movable element and holder portion. The movable element includes a permanent magnet 12. The permanent magnet 12 and the driving magnet 21 provided to extend along the substrate conveyance path 10 form magnetic coupling. The permanent magnet 12 is formed by a plurality of magnet elements so that magnetic poles with opposite polarities alternately appear in the direction in which the holder portion moves. The holder portion can be a nearly rectangular plate-shaped member having an opening 11a serving as a substrate support portion which supports the substrate 13. A substrate support gripper (not shown) can be provided around the opening 11a as a bent leaf spring to support the substrate 13. The carrier 11 employed in this embodiment has one opening 11a, and therefore can hold one substrate 13. However, when the carrier 11 has a plurality of openings 11a formed in it, it can naturally hold a plurality of substrates 13.

The substrate 13 will be described by taking a rectangular plate-shaped member as an example in this embodiment. However, upon replacing the holder portion of the carrier 11, the substrate conveyer according to the present invention can convey, for example, a disk-shaped member used for a storage medium such as a magnetic disk or an optical disk, glass substrates with various shapes, a metal substrate made of, for example, aluminum or an aluminum alloy, a silicon substrate, or a resin substrate.

The process unit includes cathodes 25 provided on the wall surfaces of each process chamber S1 to be opposed to the substrate 13 held by the carrier 11, a gas introduction device (not shown) which introduces a process gas (discharge gas) to the space around the cathodes 25, and a power supply (not shown) which supplies power to the cathodes 25. Note that the cathodes 25 are provided on the wall surfaces of each process chamber S1 on the two sides to perform a film forming process on the two surfaces of the substrate 13 at once, and targets to serve as film forming materials can be arranged on the cathodes 25, respectively.

The driving magnet 21 will be described. The driving magnet 21 includes a plurality of stator elements 27 and a driving magnet yoke 28. The driving magnet 21 is positioned on the atmospheric air side of the vacuum partition wall 35, as described above. Each stator element 27 is formed by winding an electromagnetic coil (winding wire) 33 around stator teeth 31 serving as a stator iron core, and generates a magnetic field upon supplying power to the electromagnetic coil 33. The driver 29 controls the timing at which power is supplied to the electromagnetic coil 33 of each stator element 27. As shown in FIG. 4, the stator elements 27 are arranged at positions opposed to the permanent magnet 12 of the carrier 11 on the opposite side of the vacuum partition wall 35, and are mounted on the driving magnet yoke 28 to align themselves in the direction, in which the carrier 11 travels, at nearly the same interval at which the magnet elements which constitute the permanent magnet 12 align themselves, so that they can form magnetic coupling with these magnet elements.

The driving magnet yoke 28 can be formed by, for example, a silicon steel plate with a high magnetic permeability, like the stator teeth 31, so as to fix the stator elements 27 and form a magnetic circuit. The driving magnet yoke 28 can have a rectangular shape elongated in the direction in which the carrier 11 travels. The driving magnet yoke 28 can have a shape capable of supporting the stator elements 27 mounted in one process chamber S1. The position of the driving magnet 21 relative to each process chamber S1 can be determined based on the position at which the driving magnet yoke 28 is mounted. Hence, the driving magnet yoke 28 can be mounted on the side of each process chamber S1 via a mounting jig (not shown).

The driver 29 is a device which controls excitation of each stator element 27, and is connected to a power supply (not shown) which supplies power to the electromagnetic coil 33 of this stator element 27, and a control computer (not shown) which controls each driver 29. The position to which the carrier 11 is conveyed may be controlled by connecting an encoder unit which detects the position of the carrier 11 to the driver 29, and controlling, for example, the timing, at which the driving magnet 21 (each stator element 27) is excited, based on the position information of the carrier 11. A configuration which combines each driver 29 and the control computer can be implemented as a control device.

The driver 29 can excite each stator element 27 (driving magnet 21) at a predetermined timing to exert a magnetic force generated by the driving magnet 21 on the permanent magnet 12 so as to move the carrier 11. Also, using the vacuum partition wall 35 provided between the permanent magnet 12 and the driving magnet 21, the driving magnet 21 can be arranged on the atmospheric air side, and the permanent magnet 12 can be arranged on the vacuum side. In this case, heat generated by the driving magnet 21 can be dissipated via a gas, and no vacuum feed-through for extending a wiring line from each stator element 27 to the driver 29 is necessary.

FIG. 5 is an enlarged view showing a portion H in FIG. 3. The vacuum partition wall 35 can be fitted in the opening portion 35a of each process chamber S1 from the outside, as shown in FIG. 5. An O-ring (seal member) 35b is inserted between the process chamber S1 and the edge portion of the vacuum partition wall 35 to maintain the portion (flange portion 37) in which the vacuum partition wall 35 is mounted airtight. The cross-sectional shape (the shape of a cross-section taken along the line I-I in FIG. 2) of the vacuum partition wall 35 in a cross-section perpendicular to the direction in which the carrier 11 travels is a curved surface shape convexed toward the vacuum side. The curved surface shape is a shape curved in an R shape (circularly or elliptically arcuated shape).

Since the vacuum partition wall 35 has a cross-sectional shape convexed toward the vacuum side, that is, projects toward the interior of the process chamber S1, and, more particularly, has an R-shaped (circularly or elliptically arcuated) cross-section perpendicular to the direction in which the carrier 11 travels, it is possible to reduce a stress resulting from a load that the differential pressure with respect to the atmospheric pressure imposes on the vacuum partition wall 35. This is because the load imposed on the vacuum partition wall 35 is distributed by the R-shaped portion of the vacuum partition wall 35. Thus, the thickness of the vacuum partition wall 35 in this embodiment can be made considerably smaller than that of a vacuum partition wall 35 formed by a flat plate. Also, the distance between the permanent magnet 12 and the driving magnet 21 can be shortened by fitting the surface shape of the permanent magnet 12 and the cross-sectional shape of the driving magnet 21 (each stator element 27) with the cross-sectional shape of the vacuum partition wall 35. Note that the effect can be produced to a certain extent even when the cross-sectional shape of only one of the permanent magnet 12 and driving magnet 21 fits with that of the vacuum partition wall 35.

FIG. 6A is a perspective view showing the vacuum partition wall 35, and FIG. 6B is a sectional view taken along a line III-III in FIG. 6A. The perspective view in FIG. 6A shows the vacuum partition wall 35 when viewed from the atmospheric air side. The vacuum partition wall 35 includes a rectangular flange portion 37 and a partition wall portion 39 formed integrally with the flange portion 37. The partition wall portion 39 further includes a curved portion 39a arranged between the permanent magnet 12 and the driving magnet 21, and a nearly semicircular (semielliptical) side wall portion 39b. As the material of the vacuum partition wall 35, a nonmagnetic material is suitable, and stainless steel (SUS304), for example, can be used.

In an example shown in FIGS. 6A and 6B, the curved portion 39a has an elliptical cross-sectional shape. In one embodiment, the size of the inner surface of the curved portion 39a can be defined as a width (w)=150 mm, a height (h)=60, and a thickness (t)=1.67 mm. The side wall portion 39b can be formed with a thickness of 10 mm so as to obtain a high enough strength to prevent it from deforming even upon vacuum exhaust. In one embodiment, the distance between the inner surfaces of a pair of side wall portions 39b opposed to each other on the atmospheric air sides can be 350 mm. The flange portion 37 can be formed with, for example, a thickness of 15 mm and widths of 25 mm on both the long and short sides of the vacuum partition wall 35 so as to obtain a strength high enough to prevent it from deforming even upon a mounting operation or vacuum exhaust.

By forming the partition wall portion 39 in a curved shape, the amount of bending of the partition wall portion 39 due to a differential pressure generated upon vacuum exhaust can be reduced, so that the curved portion 39a can be formed with a small thickness (t). This is done so that the curved portion 39a distributes a load generated by the atmospheric pressure. Therefore, the distance (d) between the permanent magnet 12 and the driving magnet 21 can be made smaller when the vacuum partition wall 35 is used than when a flat plate-shaped partition wall 135, as illustrated in FIG. 15, is used. This space distance (d) is exponentially correlated with the motor efficiency, resulting in a great improvement in motor efficiency. The comparison result between the thicknesses (t) of the flat plate-shaped partition wall and the vacuum partition wall 35 according to this embodiment will be described later with reference to FIG. 14.

Although an example in which the curved portion 39a is formed to have an elliptical cross-sectional shape elongated in the widthwise (w) direction has been given in this embodiment, it may be formed to have an elliptical or semicircular cross-sectional shape elongated in the height (h) direction, as a matter of course. From the viewpoint of strength, the curved portion 39a preferably has a semicircular cross-sectional shape (w/2=h). In this case, the curved portion 39a can be formed with a thickness (t) smaller than that of the curved portion 39a having an elliptical cross-sectional shape.

Also, FIG. 7 illustrates a modification (another configuration example) to this embodiment. In this configuration example, not only the distal end of the driving magnet 21 (stator teeth 31) is formed in an R shape (or an elliptical shape) which fits with the cross-sectional shape of the vacuum partition wall 35, but also an electromagnetic coil (winding wire) 34 is wound so that the shape in which the electromagnetic coil 34 is wound (the shape of the winding wire) fits with the cross-sectional shape of the vacuum partition wall 35. Since the electromagnetic coil 34 and stator teeth 31 have shapes which fit with each other and are kept close to each other, a magnetic field generated by power supplied from the power supply to the electromagnetic coil 34 can be more efficiently transmitted to the distal end of the stator teeth 31. This makes it possible to further improve the motor efficiency.

Second Embodiment

The second embodiment of the present invention will be described with reference to FIGS. 8 and 9. The same reference numerals as in the first embodiment denote the same components in the second embodiment, and a repetitive description thereof will not be given. The main difference between the second embodiment and the above-mentioned first embodiment lies in the configuration of a substrate conveyer. More specifically, the substrate conveyer according to the second embodiment has a difference in configuration of a driving magnet, permanent magnet, and vacuum partition wall from that according to the first embodiment.

Figure 8:
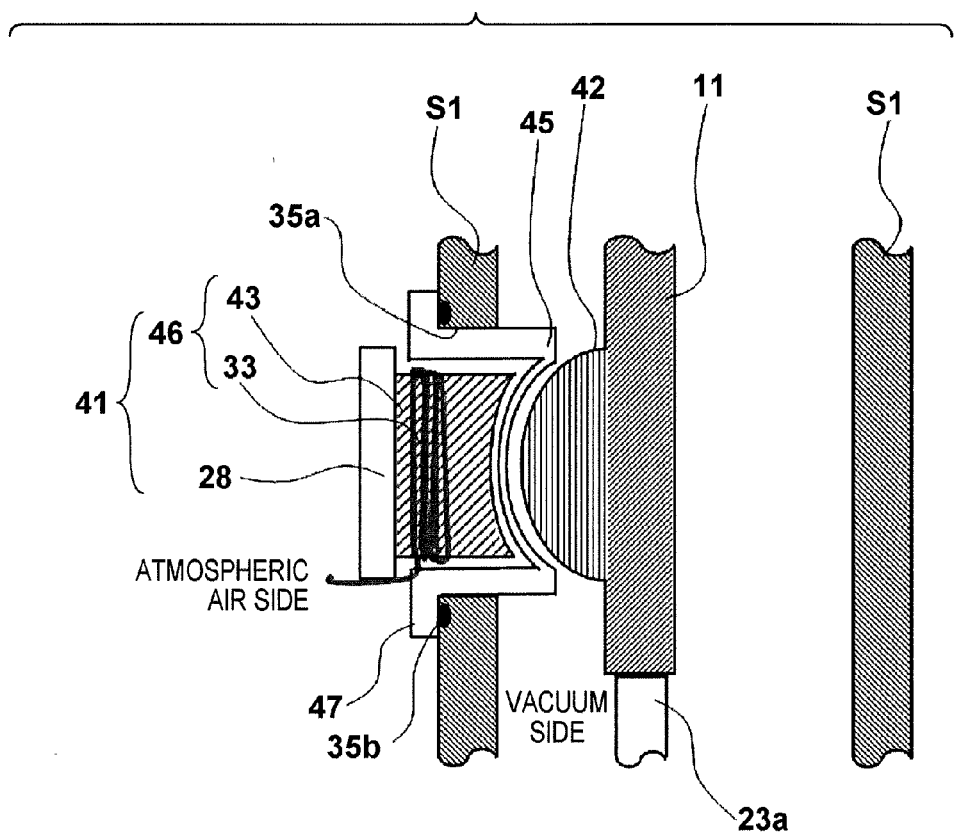
FIG. 8 is an enlarged view for explaining a vacuum processing apparatus according to the second embodiment of the present invention.

A sectional view shown in FIG. 8 is an enlarged view when the substrate conveyer according to the second embodiment is mounted in the portion H of FIG. 3. The substrate conveyer according to this embodiment uses a vertical conveyer as well, and can transfer a carrier 11 in the vertical orientation along a substrate conveyance path 40 provided to extend through process chambers S1. A driving magnet 41 and a driver 29 which controls excitation of the driving magnet 41 are arranged outside each process chamber S1, and a plurality of guides 23 which movably support the carrier 11 are arranged inside this process chamber S1. Also, a rectangular opening portion 35a is formed in the side wall of each process chamber S1 to extend along the substrate conveyance path 40, and a vacuum partition wall 45 is mounted in the opening portion 35a so as to be maintained airtight. The interior of the vacuum partition wall 45 can be evacuated into a vacuum, like that of the process chamber S1.

The driving magnet 41, a permanent magnet 42, and the vacuum partition wall 45 will be described. The driving magnet 41 is one of the main components arranged along the substrate conveyance path 40, and includes a plurality of stator elements 46 and a driving magnet yoke 28. The driving magnet 41 is positioned on the atmospheric air side of the vacuum partition wall 45. Each stator element 46 is formed by winding an electromagnetic coil 33 around stator teeth 43 serving as a stator iron core, and generates a magnetic field upon supplying power to the electromagnetic coil 33. The driver 29 controls the timing at which power is supplied to the electromagnetic coil 33 of each stator element 46. The stator elements 46 are arranged at positions opposed to the permanent magnet 42 of the carrier 11 on the opposite side of the vacuum partition wall 45, and are mounted on the driving magnet yoke 28 to align themselves in the direction, in which the carrier 11 travels, at an interval an integer multiple of that at which the magnet elements which constitute the permanent magnet 42 align themselves, so that they can form magnetic coupling with these magnet elements.

The driving magnet 41 and permanent magnet 42 have shapes different from those of the driving magnet 21 and permanent magnet 12, respectively, according to the first embodiment. The permanent magnet 42 has a cross-sectional shape convexed toward the vacuum partition wall 45 (driving magnet 41), whereas the driving magnet 41 (each stator element 46) has a cross-sectional shape concaved toward the vacuum partition wall 45 (permanent magnet 42). The vacuum partition wall 45 has a cross-sectional shape which is convexed toward the atmospheric air side, that is, projects toward the exterior of the process chamber S1, and has an R-shaped (or circularly or elliptically arcuated) cross-section perpendicular to the direction in which the carrier 11 travels. This makes it possible to reduce a stress resulting from a load that the differential pressure with respect to the atmospheric pressure imposes on the vacuum partition wall 45, as in the vacuum partition wall 35 according to the first embodiment. Thus, the thickness of the vacuum partition wall 45 can be made considerably smaller than that of a vacuum partition wall formed by a flat plate. Also, the permanent magnet 42 and the driving magnet 41 (each stator element 46) are formed to have cross-sectional shapes which fit with that of the vacuum partition wall 45.

Figure 9A:
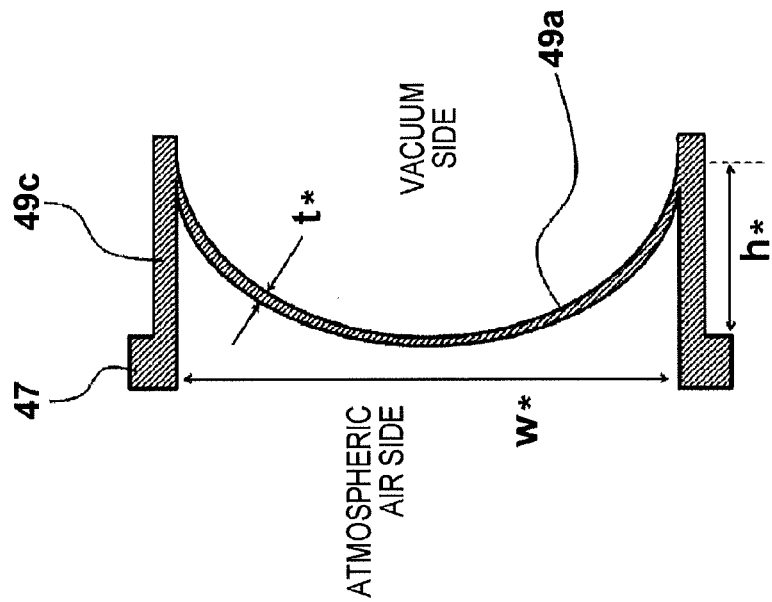
FIGS. 9A and 9B are a perspective view and a sectional view, respectively, showing a vacuum partition wall according to the second embodiment of the present invention.
Figure 9B:
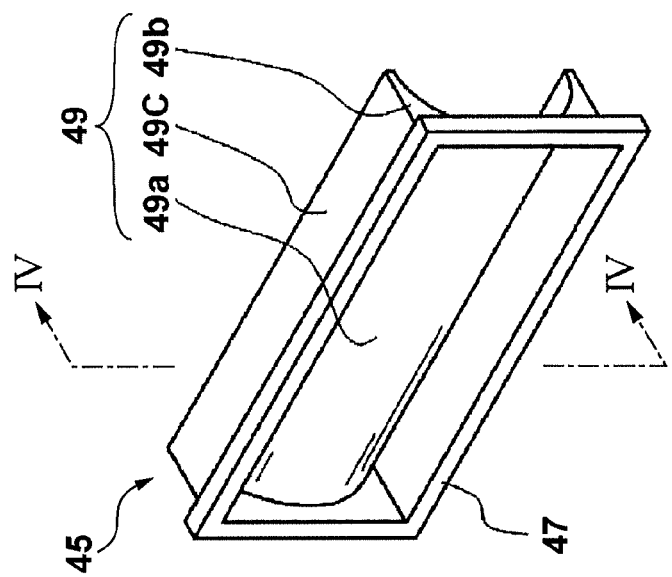

FIG. 9A is a perspective view showing the vacuum partition wall 45, and FIG. 9B is a sectional view taken along a line IV-IV in FIG. 9A. The perspective view in FIG. 9A shows the vacuum partition wall 45 when viewed from the atmospheric air side. The vacuum partition wall 45 includes a rectangular flange portion 47 and a partition wall portion 49 formed integrally with the flange portion 47. The partition wall portion 49 further includes a curved portion 49a arranged between the permanent magnet 42 and the driving magnet 41, a first side wall portion 49b which is connected to the curved portion 49a and extends vertically, and a second side wall portion 49c which is connected to the curved portion 49a and extends horizontally. As the material of the vacuum partition wall 45, a nonmagnetic material is suitable, and stainless steel (SUS304), for example, can be used.

In an example shown in FIGS. 9A and 9B, the curved portion 49a has an elliptical cross-sectional shape (elliptically arcuated cross-sectional shape). In one embodiment, the size of the inner surface of the curved portion 49a can be defined as a width (w*)=150 mm, a height (h*)=60, and a thickness (t*)=1.185 mm. The first side wall portion 49b can be formed with a thickness of 10 mm so as to obtain a strength high enough to prevent it from deforming even upon vacuum exhaust. In one embodiment, the distance between the inner surfaces of a pair of first side wall portions 49b opposed to each other on the atmospheric air sides can be 350 mm. The second side wall portion 49c can be formed with a thickness of 10 mm so as to obtain a strength high enough to prevent it from deforming even upon vacuum exhaust. The flange portion 47 can be formed with, for example, a thickness of 15 mm and widths of 25 mm on both the long and short sides of the vacuum partition wall 45 so as to obtain a strength high enough to prevent it from deforming even upon a mounting operation or vacuum exhaust.

By forming the vacuum partition wall 45 in a curved shape, the amount of bending of the partition wall portion 49 due to a differential pressure generated upon vacuum exhaust can be reduced, so that the curved portion 49a can be formed with a small thickness (t*). This is done so that the curved partition wall portion 49 (curved portion 49a) distributes a load generated by the atmospheric pressure. Therefore, the distance (d) between the permanent magnet 42 and the driving magnet 41 can be made smaller when the vacuum partition wall 45 is used than when a flat plate-shaped partition wall (see FIG. 15), as illustrated in FIG. 15, is used. This space distance (d) is exponentially correlated with the motor efficiency, resulting in a great improvement in motor efficiency.

An example in which the thicknesses of a flat plate-shaped vacuum partition wall 135 (see FIG. 15) and the vacuum partition wall 45 according to this embodiment are compared with each other will be described later with reference to FIG. 14. In a vacuum processing apparatus shown in FIG. 15, the distal ends of a permanent magnet 112 and the vacuum partition wall 135 which faces stator elements 127 are formed in rectangular shapes in conformity with the shape of the vacuum partition wall 135 having a flat surface. Each stator element 127 is formed by winding an electromagnetic coil 133 around stator teeth 141.

Although an example in which the curved portion 49a is formed to have an elliptical cross-sectional shape elongated in the widthwise (w*) direction has been given in this embodiment, it may be formed to have an elliptical or semicircular cross-sectional shape elongated in the height (h*) direction, as a matter of course. From the viewpoint of strength, the curved portion 49a preferably has a semicircular cross-sectional shape (w*/2=h*). In this case, the curved portion 49a can be formed with a thickness (t*) smaller than that having an elliptical cross-sectional shape.

Figure 10:
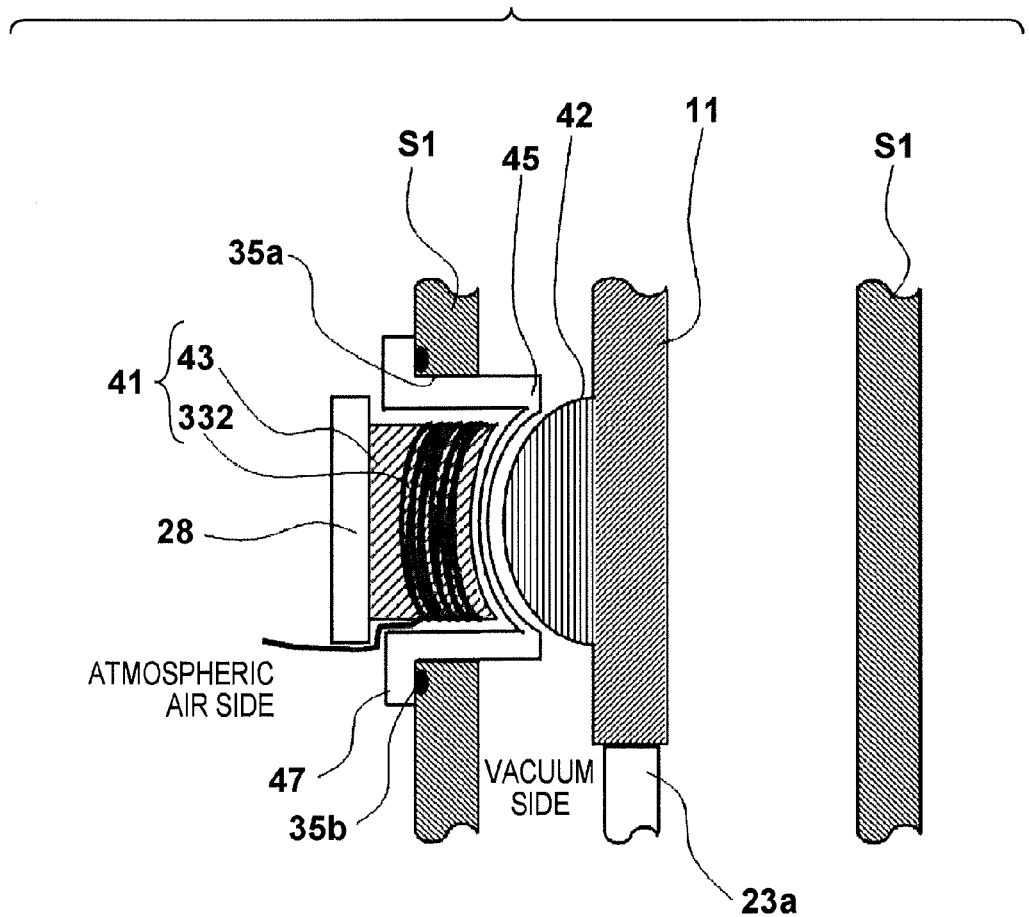
FIG. 10 is a view illustrating another example of the configuration of the vacuum processing apparatus according to the second embodiment of the present invention.

Also, although the electromagnetic coil 33 in this embodiment is linearly wound around the stator teeth 43, it may be wound so that the shape of its winding wire fits with the cross-sectional shape of the vacuum partition wall 45, as in an electromagnetic coil 332 shown in FIG. 10. Since the electromagnetic coil 33 and stator teeth 43 have shapes which fit with each other and are kept close to each other, as in the arrangement shown in FIG. 7, it is possible to further improve the motor efficiency.

Third Embodiment

The third embodiment of the present invention will be described with reference to FIGS. 11 and 12. The same reference numerals as in the first embodiment denote the same components in the third embodiment, and a repetitive description thereof will not be given. The main difference between the third embodiment and the above-mentioned first embodiment lies in the configuration of a substrate conveyer. More specifically, the substrate conveyer according to the third embodiment has a difference in configuration of a driving magnet, permanent magnet, and vacuum partition wall from that according to the first embodiment.

A sectional view shown in FIG. 11 is an enlarged view when the substrate conveyer according to the third embodiment is mounted in the portion H of FIG. 3. The substrate conveyer according to this embodiment uses a vertical conveyer as well, and can transfer a substrate 13 mounted on a carrier 11 in the vertical orientation along a substrate conveyance path 50 provided to extend through process chambers S1. A driving magnet 54 and a driver 29 which controls excitation of the driving magnet 54 are arranged outside each process chamber S1, and a plurality of guides 23 which movably support the carrier 11 are arranged inside this process chamber S1. Also, a rectangular opening portion 35a is formed in the side wall of each process chamber S1 to extend along the substrate conveyance path 50, and a vacuum partition wall 55 is mounted in the opening portion 35a so as to be maintained airtight. The interior of the vacuum partition wall 55 can be evacuated into a vacuum, like that of the process chamber S1.

The driving magnet 54 and a permanent magnet 52 have shapes different from those of the driving magnet 21 and permanent magnet 12, respectively, according to the first embodiment. In the vacuum partition wall 55 according to this embodiment, its surface opposed to the permanent magnet 52 (its surface on the vacuum side) has a two-dimensional flat (smooth) shape (smooth surface), and its surface on which the driving magnet 54 is arranged (its surface on the atmospheric air side) has a plurality of ribs (deformation preventive portion) 61 formed integrally with this surface. Because the surface of the vacuum partition wall 55 on the vacuum side is flat (smooth), the distal end of the permanent magnet 52 on the side of the vacuum partition wall 55 is formed to have a rectangular cross-section so as to maintain the same distance (equal distances) to the vacuum partition wall 55. The ribs 61 provided on the surface of the vacuum partition wall 55 on the atmospheric air side are plate-shaped members for suppressing bending (deformation) of the vacuum partition wall 55, and are inserted between a plurality of stator elements 56 mounted on a driving magnet yoke 28.

Each stator element 56 is formed by winding an electromagnetic coil (winding wire) 53 around stator teeth 51 serving as a stator iron core, and controlled by the driver 29. The stator elements 56 are arranged at positions opposed to the permanent magnet 52 of the carrier 11 on the opposite side of the vacuum partition wall 55, and are mounted on the driving magnet yoke 28 to align themselves in the direction, in which the carrier 11 travels, at an interval an integer multiple of that at which the magnet elements which constitute the permanent magnet 52 align themselves, so that they can form magnetic coupling with these magnet elements.

Portions in which no ribs 61 extend vertically are flat even on the surface of the vacuum partition wall 55 on the atmospheric air side (partition wall portion 59). Therefore, the distal end of each stator element 56, which is opposed to the surface of the vacuum partition wall 55 on the atmospheric air side, is formed to have a rectangular cross-section so as to maintain equal distances to the vacuum partition wall 55. That is, the shapes of the stator elements 56 and permanent magnet 52 are close to those of a configuration used in the flat vacuum partition wall 135, shown in FIG. 15.

Figure 12B:
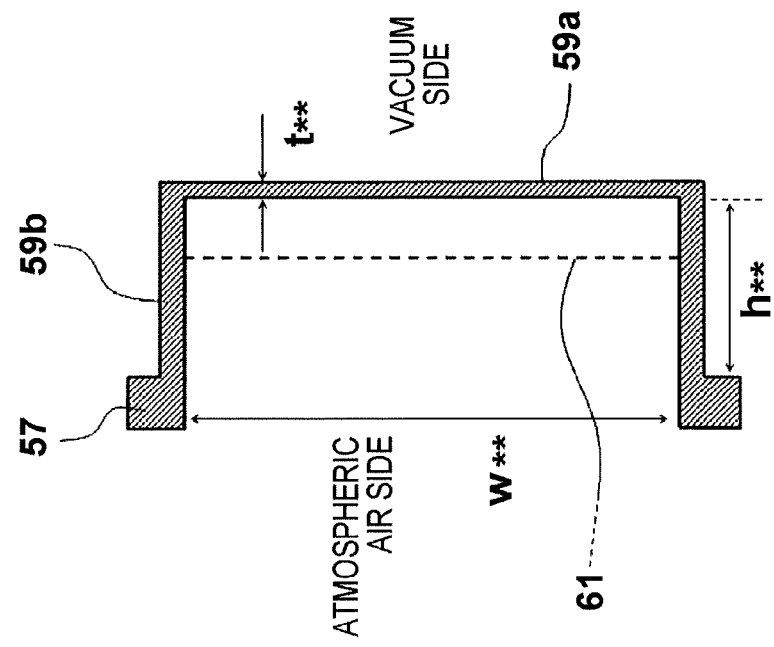
FIGS. 12A and 12B are a perspective view and a sectional view, respectively, showing a vacuum partition wall according to the third embodiment of the present invention.
Figure 12A:
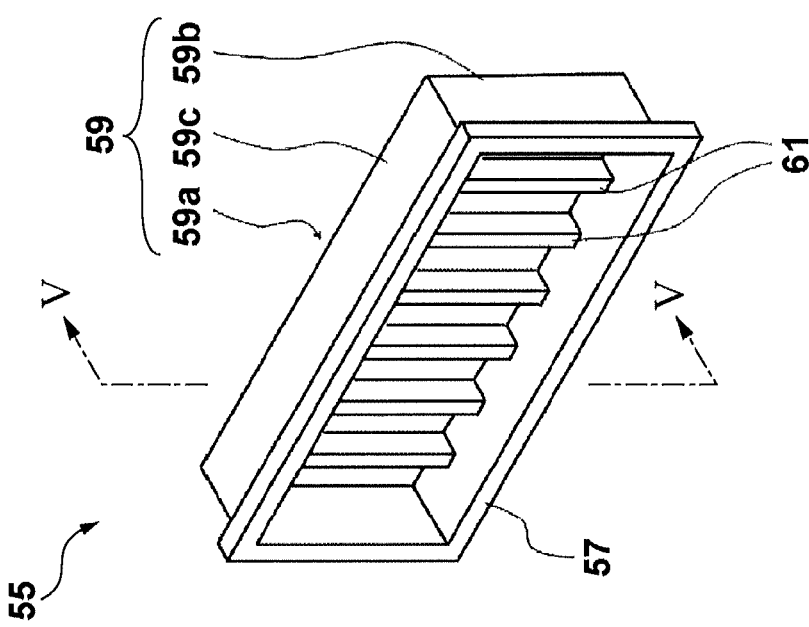

FIG. 12A is a perspective view showing the vacuum partition wall 55, and FIG. 12B is a sectional view taken along a line V-V in FIG. 12A. The perspective view in FIG. 12A shows the vacuum partition wall 55 when viewed from the atmospheric air side, and is a sectional view corresponding to the cross-sectional view taken along the line III-III (FIG. 6A) in the first embodiment. The vacuum partition wall 55 includes a rectangular flange portion 57 and a partition wall portion 59 formed integrally with the flange portion 57. The partition wall portion 59 includes an upper plate portion 59a arranged between the permanent magnet 52 and the driving magnet 54, and side wall portions 59b and 59c connected to the edge portion of the upper plate portion 59a so as to maintain the upper plate portion 59a airtight. The upper plate portion 59a includes the ribs 61. The side wall portions 59b and 59c include a pair of first side wall portions 59b which are connected to the upper plate portion 59a and extend horizontally (in the direction in which the carrier 11 travels), and a pair of second side wall portions 59c which are connected to the upper plate portion 59a and extend vertically (in a direction perpendicular to that in which the carrier 11 travels). The pair of first side wall portions 59b and pair of second side wall portions 59c are arranged in a pipe shape, and connect the upper plate portion 59a and flange portion 57 to each other so as to maintain them airtight. As the material of the vacuum partition wall 55, a nonmagnetic material is suitable, and stainless steel (SUS304), for example, can be used.

In an example shown in FIGS. 12A and 12B, the upper plate portion 59a has a shape obtained by forming the plurality of ribs 61 serving as a plurality of deformation preventive members integrally with a plate-shape member (to be referred to as a flat plate portion hereinafter) having two flat (smooth) surfaces. Each rib 61 can have, for example, a rectangular cross-sectional shape. The plurality of ribs 61 can be provided to extend, for example, vertically (in a direction perpendicular to that in which the carrier 11 travels). In other words, the plurality of ribs 61 can be formed to be suspended between the pair of opposed second side wall portions 59c so as to connect them. The plurality of ribs 61 are in contact with the second side wall portions 59c and the surface of the upper plate portion 59a on the atmospheric pressure atmosphere side.

In one embodiment, the size of the inner surface (that is, the surface on the vacuum side) of the upper plate portion 59a can be defined as a width (w)=150 mm, a height (h)=60, and a thickness (t)=0.45 mm. Each rib 61 has a strength high enough to suppress deformation of the flat plate portion of the upper plate portion 59a even upon vacuum exhaust. In one embodiment, the feature of each rib 61 can be defined as a length (a dimension in the direction of w)=60 mm, a height (a dimension in the direction of h)=18 mm, a thickness (a dimension in the direction in which the carrier 11 travels)=4 mm, and a pitch (a distance between the ribs 61)=24 mm. Both the side wall portions 59b and 59c can be formed with a thickness of 10 mm so as to obtain a strength high enough to prevent them from deforming even upon vacuum exhaust. The distance between the inner surfaces of a pair of side wall portions 59b opposed to each other in the direction in which the carrier 11 travels can be 350 mm. The flange portion 57 can be formed with, for example, a thickness of 15 mm and widths of 25 mm on both the long and short sides of the vacuum partition wall 55** so as to obtain a strength high enough to prevent it from deforming even upon vacuum exhaust.

Since the ribs 61 reduce a load imposed on the flat plate portion of the upper plate portion 59a as the differential pressure with respect to the atmospheric pressure acts on the vacuum partition wall 55, bending of the upper plate portion 59a can be suppressed. Thus, the thickness of the upper plate portion 59a of the vacuum partition wall 55 can be made considerably smaller than that of an upper plate portion of a vacuum partition wall, which is formed by a simple flat plate. Also, the permanent magnet 52 and the driving magnet 54 (each stator element 56) are formed to have cross-sectional shapes which fit with that of the vacuum partition wall 55. Therefore, the distance (d) between the permanent magnet 52 and the driving magnet 54 can be made smaller when the vacuum partition wall 55 is used than when the conventional flat plate-shaped partition wall (see FIG. 15) is used.

This space distance (d) is exponentially correlated with the motor efficiency, resulting in a great improvement in motor efficiency. Although all the ribs 61 are formed to be inserted into the gaps between adjacent stator elements 56 in this embodiment, they may be formed only at the central portion bent in a large amount, as a matter of course. That is, the ribs 61 can have any configuration as long as they have a strength high enough to suppress deformation of the upper plate portion 59a so that its amount falls within a predetermined tolerance even upon vacuum exhaust.

Figure 13:
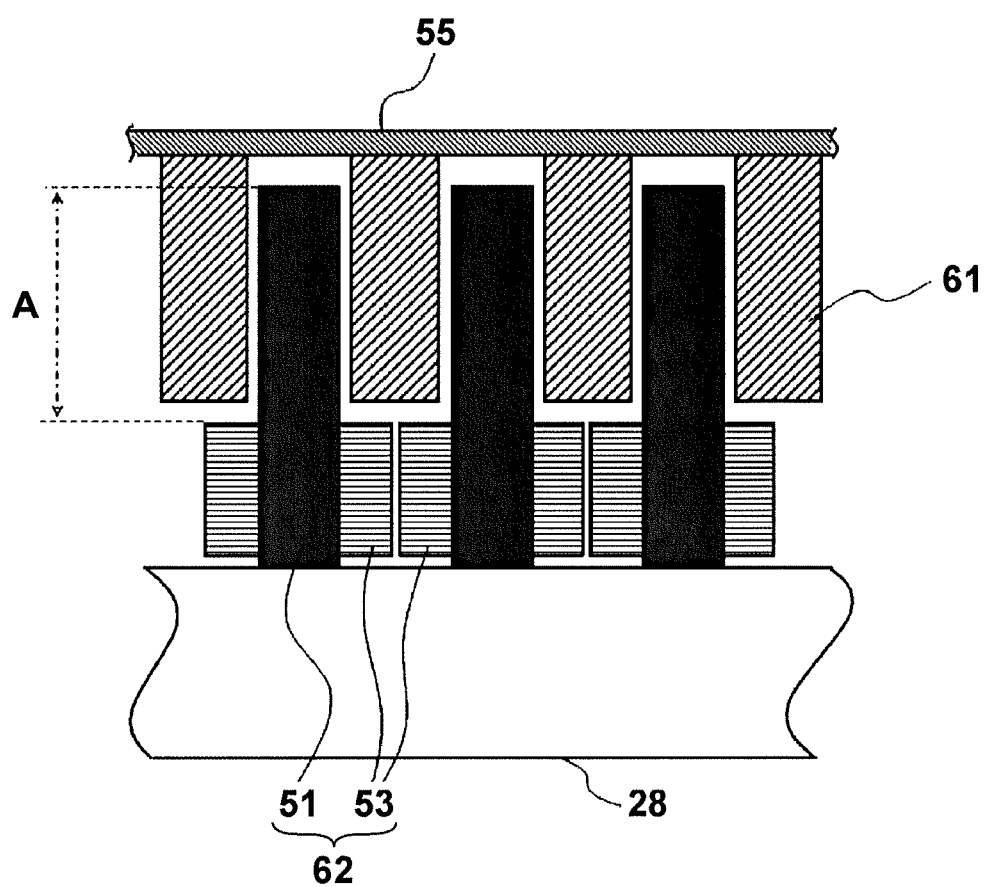
FIG. 13 is a view illustrating another example of the configuration of the vacuum processing apparatus according to the third embodiment of the present invention.

Also, FIG. 13 illustrates, a modification (another configuration example) to this embodiment, and their difference lies in stator elements 62. More specifically, the arrangement of the ribs 61, stator teeth 51, and electromagnetic coil (winding wire) 53 in this embodiment is modified in this modification. Note that FIG. 13 is a schematic enlarged view for explaining the portion of the stator elements 62, and corresponds to the cross-section taken along the line II-II in FIG. 3.

Each stator element 62 is formed by winding the electromagnetic coil 53 around the stator teeth 51 on the side of the driving magnet yoke 28, and not winding it around the stator teeth 51 on the side of the vacuum partition wall 55. The stator elements 62 are arranged so that the ribs 61 are inserted into portions in which no electromagnetic coils 53 are wound. That is, the stator elements 62 are arranged so that each electromagnetic coil 53 is wound around the stator teeth 51 in a portion spaced apart from the upper plate portion 59a, and each rib 61 is inserted between a set of stator teeth 51 (a region A in FIG. 13) of adjacent stator elements 62 in a portion in which no electromagnetic coil 53 is wound.

With such a configuration, a given thickness (a given dimension in the direction in which the carrier 11 travels) and a given height (a given dimension in the direction of h) can be ensured for each rib 61 even in a narrow space. Especially in narrowing the interval between the magnet elements of the permanent magnet 52, this configuration is effective because the interval between the stator elements 62 must be narrowed as well. Narrowing the interval between the magnet elements of the permanent magnet 52 makes it possible to increase the number of magnets in the direction in which the carrier 11** travels, so the substrate conveyer can be increased in power and downsized without lessening the effect of this embodiment.

Figure 14:
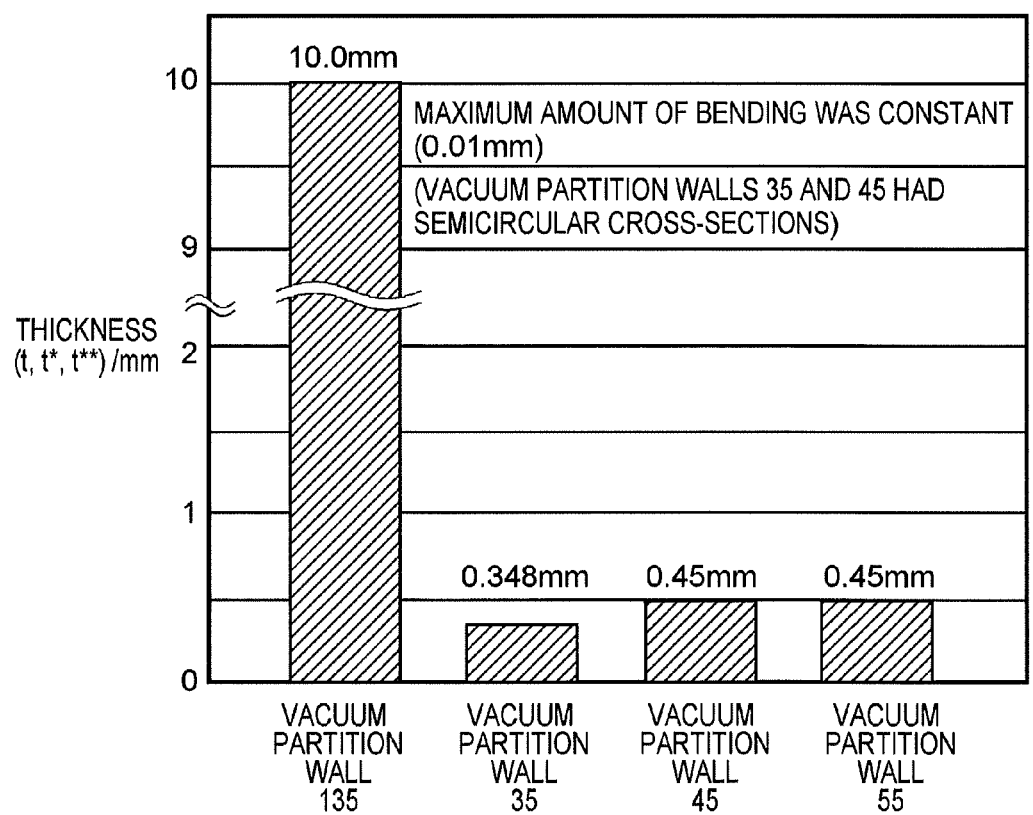
FIG. 14 is a comparative view showing the required thicknesses of the vacuum partition walls according to the first and second embodiments of the present invention.

FIG. 14 is a comparative view showing the thicknesses of the vacuum partition walls, and shows the required thicknesses of the vacuum partition walls 35, 45, and 55 according to the above-mentioned embodiments, and the flat plate-shaped vacuum partition wall 135 shown in FIG. 15. FIG. 14 illustrates an example of the analysis result obtained by simulation. Simulation models will be described first. In this simulation, the vacuum partition walls 35 and 45 had semicircular cross-sections. The semicircular cross-sections mean a cross-section having a shape described by w/2=h=75 mm in the vacuum partition wall 35, and a cross-section having a shape described by w*/2=h*=75 mm in the vacuum partition wall 45. All the vacuum partition walls 35, 45, 55, and 135 were analyzed using models obtained by cutting them into ¼ at their horizontal and vertical central portions.

The atmospheric surface load was uniform, that is, a load (98.067 N/m²) resulting from the differential pressure between the vacuum pressure and the atmospheric pressure was uniformly imposed on all the inner wall surfaces of the vacuum partition walls on the atmospheric air side from the atmospheric air sides. The materials of all the vacuum partition walls 35, 45, 55, and 135 were SUS304 (Modulus of Elasticity E=1.9×10¹¹ N/m²). The outer surface portions of the flange portions 37, 47, 57, and 137 were fixed (constrained). The outer surface portions mean the surface of each flange portion, which is opposite to that in contact with the opening portion 35a, and is denoted by reference symbol Q in FIG. 5. Note that the flange portions 37, 47, 57, and 137 in the respective embodiments have the same size defined as widths of 25 mm on both the long and short sides of the vacuum partition walls, and a thickness of 15 mm.

Thicknesses (t, t*, t**) at which the maximum amount of displacement upon bending (the maximum amount of bending) at the central portions of the surfaces of the vacuum partition walls 35, 45, 55, and 135, which are opposed to the permanent magnets 12, 42, and 112, respectively, is 0.01 mm were analyzed for the vacuum partition walls 35, 45, 55, and 135. The central portions of the surfaces of the vacuum partition walls 35, 45, 55, and 135 were defined as the vertical and horizontal central portions of the curved portion 39a, 49a, and 59a. Also, the maximum amount of bending means the amount of displacement in the direction of h (h*, h**) when the central portion of the vacuum partition wall 135 (curved portions 39a and 49a) deforms toward the vacuum side when a load resulting from the differential pressure between the vacuum pressure and the atmospheric pressure is imposed on the vacuum partition walls 35, 45, 55, and 135.

The simulation result reveals that the thickness at which the maximum amount of bending was 0.01 mm was 10.0 mm in the vacuum partition wall 135 (see FIG. 15) having a flat (planar) cross-sectional shape, but was 0.348 mm in the vacuum partition wall 35 (FIG. 6A) in the first embodiment, was 0.45 mm in the vacuum partition wall 45 (FIG. 9A) in the second embodiment, and was 0.45 mm in the vacuum partition wall 55 (FIG. 12A) in the third embodiment. That is, this simulation result shows that the vacuum partition wall 135 having a planar cross-sectional shape requires a thickness of about 10 mm, whereas the thicknesses of the curved portions 39a and 49a and upper plate portion 59a can be equal to or smaller than 1 mm in the configurations according to the first to third embodiments.

The space distances (d) between the distal ends of the sets of stator teeth 31, 43, and 51 and the surfaces of the permanent magnets 12, 42, and 52 can be made considerably shorter when the vacuum partition walls 35, 45, and 55 are used than when the vacuum partition wall 135 having a planar cross-sectional shape is used. When the gaps between the vacuum partition walls 35, 45, 55, and 135 and the distal ends of the sets of stator teeth 31, 43, and 51 have a width of 0.5 mm, and those between the vacuum partition walls 35, 45, 55, and 135 and the surfaces of the permanent magnets 12, 42, 52, and 112 in a vacuum have a width of 1.0 mm, the space distances (d) of the vacuum partition walls 35, 45, and 55 can be ⅓ or less of that of the vacuum partition wall 135. These space distances (d) are exponentially correlated with the motor efficiency, resulting in a great improvement in motor efficiency.

As described above, by reducing a stress resulting from the differential pressure with respect to the atmospheric pressure, which acts on the vacuum partition walls 35, 45, and 55, the thicknesses of the curved portions 39a and 49a and upper plate portion 59a of the vacuum partition walls 35, 45, and 55 can be reduced, thus narrowing the spaces between the surfaces of the driving magnets 21, 41, and 54 and those of the permanent magnets 12, 42, and 52. This improves the motor efficiency, so the driving source and driving wiring can be downsized, and the ratio of the cost for safety measures can be reduced as a result of a reduction in current. This makes it possible to provide the user with a low-cost, compact, safe apparatus.

Moreover, the vacuum partition wall 45 (second embodiment) does not adopt a structure in which the curved portion 49a projects toward the vacuum side, unlike the vacuum partition wall 35 (first embodiment), it is possible to bring the outer wall of each process chamber S1 closer to the carrier 11. This, in turn, makes it possible to reduce the space in the vacuum of the process chamber S1. Thus, in the vacuum processing apparatus according to the second embodiment, the process chambers S1 and the exhaust system (for example, a vacuum pump) can be downsized, and the entire vacuum processing apparatus, in turn, can be downsized, compared to the first embodiment. Further, as is apparent from the above-mentioned simulation result (see FIG. 14), the vacuum processing apparatus according to the second embodiment can produce a satisfactory result in terms of an improvement in motor efficiency.

Also, the vacuum partition walls 35, 45, and 55 are formed to have a structure obtained by almost halving a cylinder in place of a whole cylindrical structure, it is possible to efficiently dissipate heat from the stator elements 27 and 46 to the atmospheric air. This, in turn, makes it possible to decrease the coil resistance, thus further improving the efficiency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-291272, filed Dec. 27, 2010, which is hereby incorporated by reference herein in its entirety.

What is claimed is:

1. A substrate conveyer which conveys, in a chamber, a carrier that holds a substrate, the conveyer comprising:
   a permanent magnet provided on the carrier in the vacuum chamber;
   a vacuum partition wall which is arranged in an opening portion of the vacuum chamber, the vacuum partition and the vacuum chamber being configured to partition an inner space for processing the substrate from an outer space with an atmospheric pressure; and
   a driving magnet provided outside the vacuum partition wall so as to drive the carrier on which the permanent magnet is provided, the driving magnet including a plurality of stator elements each including a stator iron core and a winding wire wound around the stator iron core,
   the vacuum partition wall including a plate portion having a flat surface that is opposed to the permanent magnet, a side wall portion connecting an edge of the plate portion and the vacuum chamber to each other, and a plurality of deformation preventive portions, wherein the plurality of deformation preventive portions are arranged on a surface opposite to the flat surface so as to connect portions of the side wall portion, which are opposed to each other, to suppress bending of the plate portion, wherein the deformation preventive portions are arranged between adjacent coils.

2. The conveyer according to claim 1, wherein the winding wires are wound around first parts of the stator iron cores which are spaced apart from the upper plate portion, and the deformation preventive portions are arranged between second parts of the stator iron cores, where the winding wires are not wound, and the deformation preventive portions are not arranged between the first parts of the stator iron cases.

3. A vacuum processing apparatus comprising:

a substrate conveyer defined in claim 1; and a system configured to perform a predetermined vacuum process, in the vacuum chamber, for a substrate conveyed by the substrate conveyer.

4. An apparatus including a chamber configured to form a reduced-pressure space in the chamber, a carrier which holds a substrate, and a conveyer which conveys the carrier in the chamber, the chamber including a side wall having an opening portion, and a partition wall arranged in the opening portion so as to partition the reduced-pressure space from an outer space with an atmospheric pressure, the conveyer including a permanent magnet provided on the carrier, and a driving magnet arranged outside the partition wall so as to drive the carrier, and the partition wall including first portion arranged between the driving magnet and a path through which the carrier passes, and a second portion arranged to connect the first portion and the side wall to each other, the first portion having a flat surface that faces the path, and the first portion including a plurality of ribs arranged on a surface thereof opposite to the flat surface.

5. The apparatus according to claim 4, wherein the second portion includes a pair of side wall portions opposed to each other, and each rib is arranged to connect one of the pair of side wall portions to the other.

6. The apparatus according to claim 4, wherein the driving magnet includes a plurality of coils, and the ribs are arranged between the coils.

7. The apparatus according to claim 4, wherein the driving magnet includes a plurality of stator elements each including a stator iron core and a winding wire wound around the stator iron core, the winding wires are wound around first parts of the stator iron core, which are spaced apart from the first portion, and the ribs are arranged between second parts of the stator iron cores, where the winding wires are not wound, and the ribs are not arranged between the first parts of the stator iron cores.

* * * * *